US00RE45667E

(19) United States
(12) Reissued Patent
Tsironis

(10) Patent Number: US RE45,667 E
(45) Date of Reissued Patent: Sep. 8, 2015

(54) ADAPTABLE PRE-MATCHED TUNER SYSTEM AND METHOD

(71) Applicant: Christos Tsironis, Kirkland (CA)

(72) Inventor: Christos Tsironis, Kirkland (CA)

(21) Appl. No.: 14/013,156

(22) Filed: Aug. 29, 2013

Related U.S. Patent Documents

Reissue of:
(64) Patent No.: 6,674,293
Issued: Jan. 6, 2004
Appl. No.: 09/592,983
Filed: Jun. 13, 2000

(51) Int. Cl.
*G01R 27/00* (2006.01)
*H03H 7/38* (2006.01)
*H01Q 3/32* (2006.01)

(52) U.S. Cl.
CPC ..... *H01Q 3/32* (2013.01)

(58) Field of Classification Search
CPC ..... G01R 27/30; G01R 27/32
USPC ..... 324/638, 642, 629, 637, 534; 330/236, 330/237; 333/17.3, 32, 33, 34, 35; 702/107
See application file for complete search history.

(56) References Cited

U.S. PATENT DOCUMENTS 3,069,629 A * 12/1962 Wolff ..... 326/99
3,227,950 A * 1/1966 Watts, Jr. ..... 324/648
3,242,444 A * 3/1966 Weinschel ..... 333/33
3,264,584 A * 8/1966 Edwards ..... 333/33
3,337,821 A * 8/1967 Engelbrecht ..... 333/205
3,851,271 A * 11/1974 Cooke et al. ..... 331/47
4,041,395 A * 8/1977 Hill ..... 455/115.4
4,096,453 A * 6/1978 Rogers ..... 331/117 D
4,267,532 A * 5/1981 Saleh ..... 333/33
4,535,307 A * 8/1985 Tsukii ..... 333/35
4,751,480 A * 6/1988 Kunz et al. ..... 333/129
4,912,402 A * 3/1990 Angelucci et al. ..... 324/750.25
5,079,507 A * 1/1992 Ishida et al. ..... 324/645
5,363,060 A * 11/1994 Kohno ..... 330/286
5,406,224 A * 4/1995 Mikami et al. ..... 330/277
5,430,417 A * 7/1995 Martin et al. ..... 333/33

(Continued)

OTHER PUBLICATIONS

Wholey, W.B.; Eldred, W.N., A New Type of Slotted Line Section, Mar. 1950, Proceedings of the IRE, (vol. 38, Issue: 3) pp. 244-248, ISSN:0096-8390.*
Focus Microwaves Product Note 45, Nov. 1997.*

(Continued)

*Primary Examiner* — Patrick Assouad
*Assistant Examiner* — Christopher McAndrew

(57) ABSTRACT

The present invention is an adaptable pre-matched tuner system and calibration method for measuring reflection factors above Γ=0.85 for a DUT. The system includes a first and second large-band microwave tuners connected in series, the first and second large-band tuners being mechanically and electronically integrated; and a controller for controlling the two large-band tuners. The first tuner is adapted to act as a pre-matching tuner and the second tuner is adapted to investigate an area of a Smith Chart that is difficult to characterise with a single tuner, so that the combination of the first and second large-band tuners permits the measurement of reflection factors above Γ=0.85. The pre-matched tuner system allows the generation of a very high reflection factor at any point of the reflection factor plane (Smith Chart). The pre-matched tuner must be properly calibrated, such as to be able to concentrate the search for optimum performance of the DUT in the exact location of the reflection factor plane where the DUT performs best, using a pre-search algorithm.

6 Claims, 11 Drawing Sheets

(56) References Cited

U.S. PATENT DOCUMENTS 5,910,754 A * 6/1999 Simpson et al. ..... 333/17.3
6,297,649 B1 * 10/2001 Tsironis ..... 324/642

OTHER PUBLICATIONS

Bali et al., Maury Microwave Brochure, Jan. 2001, pp. 1-11.*
Anritsu Application Note, pp. 1-16, Nov. 2001.*
Cusack, Joseph M., et al., Automatic Load Contour Mapping for Microwave power Transistors; IEEE Transactions on Microwave Theory and Techniques, vol. MMT-22, No. 12, Dec. 1974, pp. 1146-1152.*
Sachi H., et al., A Computer-Controlled Microwave Tuner for Automated Load Pull, RCA Review, vol. 44 Dec. 1983, pp. 566-583.*
Perlow, Stewart M., New Algorithms for the Automated Microwave Tuner System, RCA Review, vol. 46, Sep. 1985, pop 441455.*
Focus Microwaves Application Note 8, Jun. 1994.*
"Pre-Matched Automated Tuner," Maury Microwave Corporation,, Ontario, Canada, Model MT981 D. Jun. 7, 2000, P.1.
Product Note 44, Programmable Harmonic tuner PHT, Focus Microwaves, Nov. 1997.
US Patent 6,297,649, Harmonic Rejection load tuner.
Printout of website www.focus-microwaves.com section Literature/manual tuners.
Printout of website www.focus-microwaves.com section Literature/harmonic tuners.
Prematching tuners for very high VSWR and load load pull measurements. Product note 52, Focus Microwaves, Mar. 1999.
Load Pull test instruments meet . . . Applied Microwave & Wireless, Dec. 1999, pp. 84ff.
Prematching tuners for very high SWR . . . Microwave Journal, Jan. 2000, pp. 176ff.
Christos Tsironis, Prematching Tuners for Very High VSWR and Power Load Pull Measurements, Focus Microwaves Product Note 52, Mar. 1999, p. 1-4, Focus Microwaves, St. Laurent, Canada.
Focus Microwaves, Instruments Simplify Load Pull Testing of High Power Transistors, Applied Microwaves & Wireless, Dec. 1999, p. 84-92, vol. 11 No. 12, Noble Publishing, Tucker, GA USA.
Focus Microwaves, Prematching Tuners for Very High SWR and Power Load Pull Measurements, Microwave Journal, Jan. 2000, p. 176-178, vol. 43 No. 1, Horizon House Publishing, Norwood, MA USA.
Christos Tsironis, Programmable Harmic Tuner PHT, Focus Microwaves Product Note 44, Nov. 1997, p. 2, Focus Microwaves, St. Laurent, Canada.
Printout of website: www.focus-microwaves.com from section Literature/Manual Tuners.
Printout of website: www.focus-microwaves.com from section Literature/Harmonic Tuners.
Order form and confirmation (33627) for printing PN-45, on Jul. 2, 1999, as indicated by arrows.

* cited by examiner

Figure 5: Prior Art

Figure 6: Prior Art

STANDARD TUNER SET_UP

PREMATCHED TUNER SYSTEM SET-UP

GROUND PLANE

ADAPTABLE PRE-MATCHED TUNER SYSTEM AND METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

Related Applications

This application claims priority from U.S. Provisional Patent Application No. 60/186,203 filed Mar. 1, 2000, which is incorporated herein by reference.

FIELD OF THE INVENTION

The present invention relates to an adaptable pre-matched tuner system and method, and more particularly to such a system to be used in load-pull set-ups for the measurement, characterisation and testing of RF or microwave devices. It is particularly useful when devices presenting very high reflection factors have to be measured, such as high-power, low impedance transistors, diodes and MMICs, especially when operated in saturated mode.

DESCRIPTION OF THE PRIOR ART

Traditional large-band microwave tuners have been used for some time already to synthesize impedances within RF/microwave measurement set-ups. Their capability of synthesizing high reflection loads is however somewhat limited, which makes that in practice they cannot be used reliably when characterising the high-power, low-impedance devices that have appeared in the market during the recent years.

These limitations are mainly of two natures:

a) Power Limitations

In active tuners, the maximum handling capability is determined by the characteristics of the active circuitry inside, and is generally extremely low, usually below 1 Ampere.

In electromechanical tuners, the maximum handling capability is related to the connector current handling capability, as, at high reflection factors, very high currents are generated. Also, voltage limitations are also an issue as corona discharges can take place between the tuning slug and the central conductor at impedances at which the gap between the two becomes very small.

b) Accuracy Limitations

Even when power limitations are not a factor, traditional tuners, especially electromechanical ones, cannot generate, characterise and reproduce, accurately and consistently, reflection factors higher than approximately 0.90. Also, network analysers, which in some cases constitute an integral part of the calibration set-up, become less and less accurate when very high reflection factor loads ($\Gamma \geq 0.95$) are to be measured.

To overcome these inherent difficulties of traditional large-band tuners, a solution has already been proposed: an impedance transformer can be introduced between the DUT and the tuner (see FIG. 6), so as to reduce the reflection factor requirement at the tuner ports, by effectively shifting the impedance seen by the tuner into a Smith Chart area which it can cover adequately.

In fact, impedance transformers can be of different types, but up to now the ones that have been described in the literature are $\lambda/4$ transmission lines, used when microstrip or stripline devices mounted on a test-jig have to be characterised, and pre-matching probes, when on-wafer measurements need to be performed.

These impedance transformers do sometimes work, but they are not always practical: they are inherently narrowband, they involve significant additional ohmic losses along the measurement set-up signal path and they cannot be adjusted. This means that a long and complicated trial-and-error process has to take place whenever a new device has to be characterised, or even when the measurement frequency is changed. Also, in practice, no phase control is possible. Finally, $\lambda/4$ transmission lines might also prove cumbersome to implement because, for lower frequencies (<500 MHz) and larger transformation ratios (more than 4:1), transmission lines become extremely long and wide.

SUMMARY OF THE INVENTION

It is an object of the present invention to provide an adaptable pre-matched tuner system and calibration method which resolves the above-noted deficiencies in the prior art. In accordance with the invention, this object is achieved with an adaptable pre-matched tuner system for measuring reflection factors above $\Gamma=0.85$ for a DUT, comprising a first and second large-band microwave tuners connected in series, said first and second large-band tuners being mechanically and electronically integrated; and a controller for controlling the two large-band tuners. The first tuner is adapted to act as a pre-matching tuner and the second tuner is adapted to investigate an area of a Smith Chart that is difficult to characterise with a single tuner, so that the combination of the first and second large-band tuners permits the measurement of reflection factors above $\Gamma=0.85$.

The pre-matched tuner system allows the generation of a very high reflection factor at any point of the reflection factor plane (Smith Chart). The pre-matched tuner must be properly calibrated, such as to be able to concentrate the search for optimum performance of the DUT in the exact location of the reflection factor plane where the DUT performs best, using a pre-search algorithm.

BRIEF DESCRIPTION OF THE DRAWINGS

The present invention and its advantages will be more easily understood after reading the following non-restrictive description of preferred embodiments thereof, made with reference to the following drawings in which.

DESCRIPTION OF A PREFERRED EMBODIMENT OF THE INVENTION

The present invention concerns a microwave tuner, which is capable of reliably and consistently synthesizing extremely large ranges of loads ($0 \leq \Gamma \leq 0.995$), with phases which can be chosen arbitrarily.

The tuner of the present invention comprises the following fundamental elements integrated in a single system:

a) an input large-band microwave tuner whose purpose is to perform an adjustable impedance transformation (Pre-matching tuner, for a specific Smith-chart area pre-tuning);

b) a traditional large band tuner for accurate impedance synthesizing; and c) a controller which controls the adjustment of the two tuners and which relies on an algorithm capable of calculating, by interpolation, for each required impedance to synthesize, all the tuners' adjustments.

The proposed solution consists in integrating within the same housing the mechanics and the electronics of two traditional electromechanic large-band tuners mounted in a cascaded configuration. By properly adjusting the first tuner, it can be made to actually act as an impedance transformer, effectively replacing the $\lambda/4$ transmission lines or the pre-matching probe of the prior art. The second tuner is thus able to operate within a Smith Chart region in which it functions accurately without being submitted to excessive current loads. As a common controller controls both tuners, calibration and control can be performed precisely and in a repeatable fashion.

In fact, there are several benefits to the use of a large-band electromechanical tuner for prematching purposes instead of a $\lambda/4$ transmission line or a pre-matching probe. The most important are:

a) The tuner can be easily adjusted so as to adapt the measurement set-up to a different frequency or a different device;

b) No additional phase shifting devices are required as the tuner can be calibrated and adjusted both for any magnitude and phase;

c) Resistive losses are much lower;

d) One of the tuners can be made "transparent" (look like a 50 Ohm line) by raising its tuning slug sufficiently high. This feature is particularly interesting when devices prone to oscillate are measured, as pre-matching parameters can be changed gradually, and thus critical Smith Chart regions can be avoided; and e) Phase can be controlled (at any frequency).

Figure 2A:
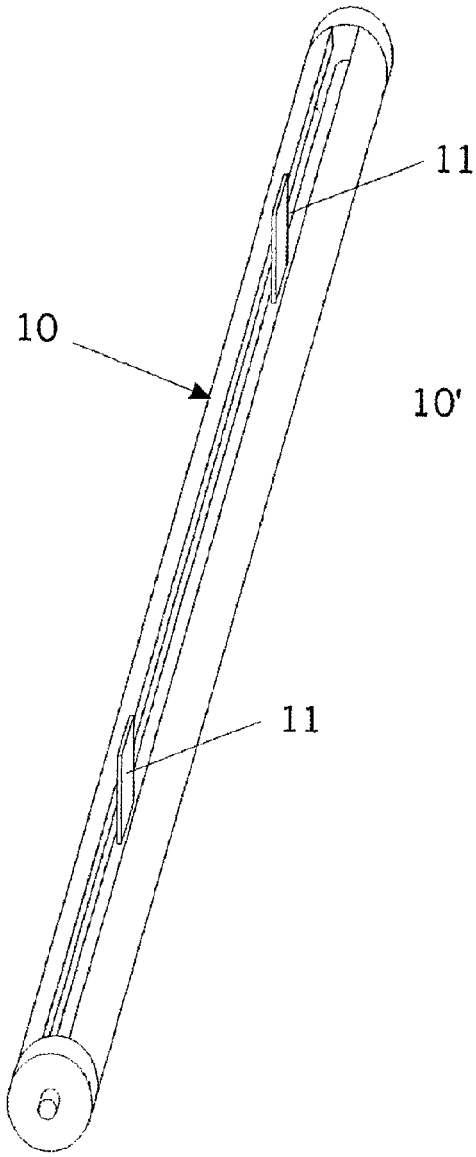
FIGS. 2a and 2b are schematic representations of the two large-band tuners in series, according to preferred embodiments of the invention.
Figure 2B:
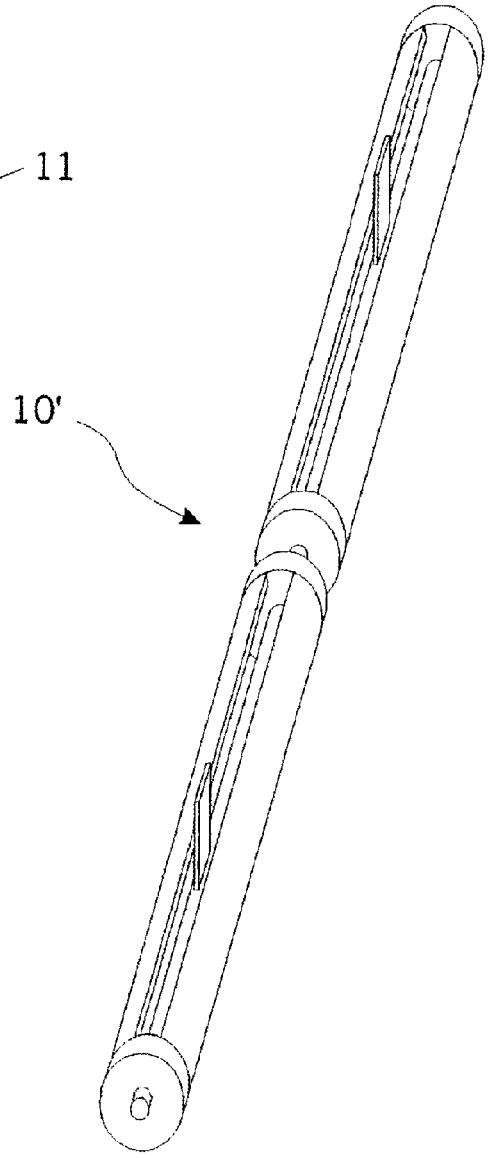

Consequently, referring now to the appended Figures, the system of the present invention comprises, as mentioned previously, two cascaded large-band tuners. FIG. 2 shows two preferred embodiments of the invention. In a first preferred embodiment, the tuner is a single tuner, but provided with two tuning slugs, each independently controlled. In a second preferred embodiment, two full large-band tuners are connected in series. The disadvantage with the second preferred embodiment is that some losses will be produced at the junction between the two tuners, which will limit the maximum obtainable reflection factor.

Figure 1:
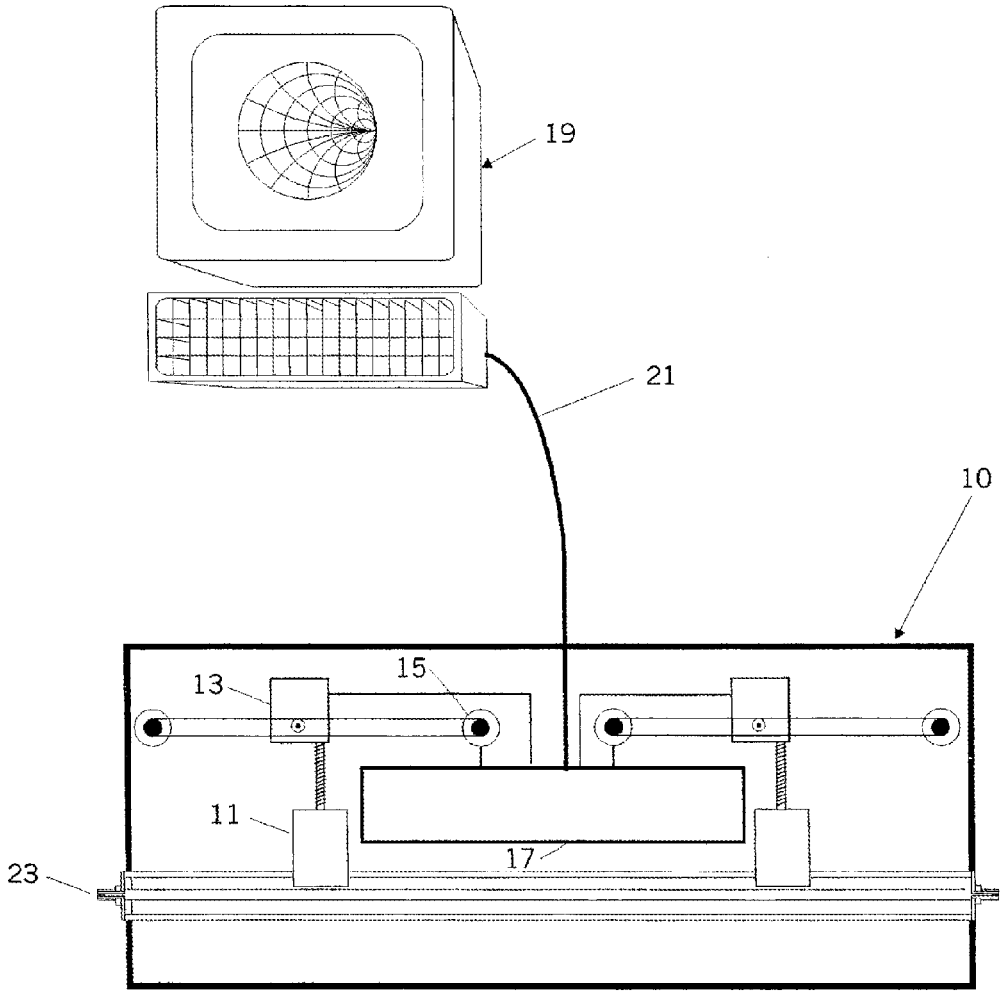
FIG. 1 is a schematic representation of a pre-matched tuner system according to the present invention.

FIG. 1 illustrates, in a schematic fashion, the elements of the system according to the present invention. The adaptable pre-matched tuner system includes two typical large-band tuners 10 cascaded, or connected in series. The two large-band tuners 10 can be a single tuner provided with two tuning slugs 11 (FIG. 2a), or two tuners 10' connected in series, as better shown in FIG. 2b (which shows, for clarity, only the tuners, but not the other elements).

As is usual, each of the tuners includes vertical displacement motors 13 for the slugs 11, horizontal displacement motors 15 for the slugs and an electronic module 17 for driving the motors and interfacing with a controller 19. The invention provides, in a preferred embodiment thereof, for the integration of the motors 13, 15 and the electronic module 17 into a single housing.

The controller 19 controls the displacement of the tuning slugs 11, and records data related to the tuners. The controller 19 is preferably connected to the pre-matched tuners 10 through a bus 21. Connectors 23 are provided for connecting the tuners 10 to other equipment in the set-up.

Figure 3:
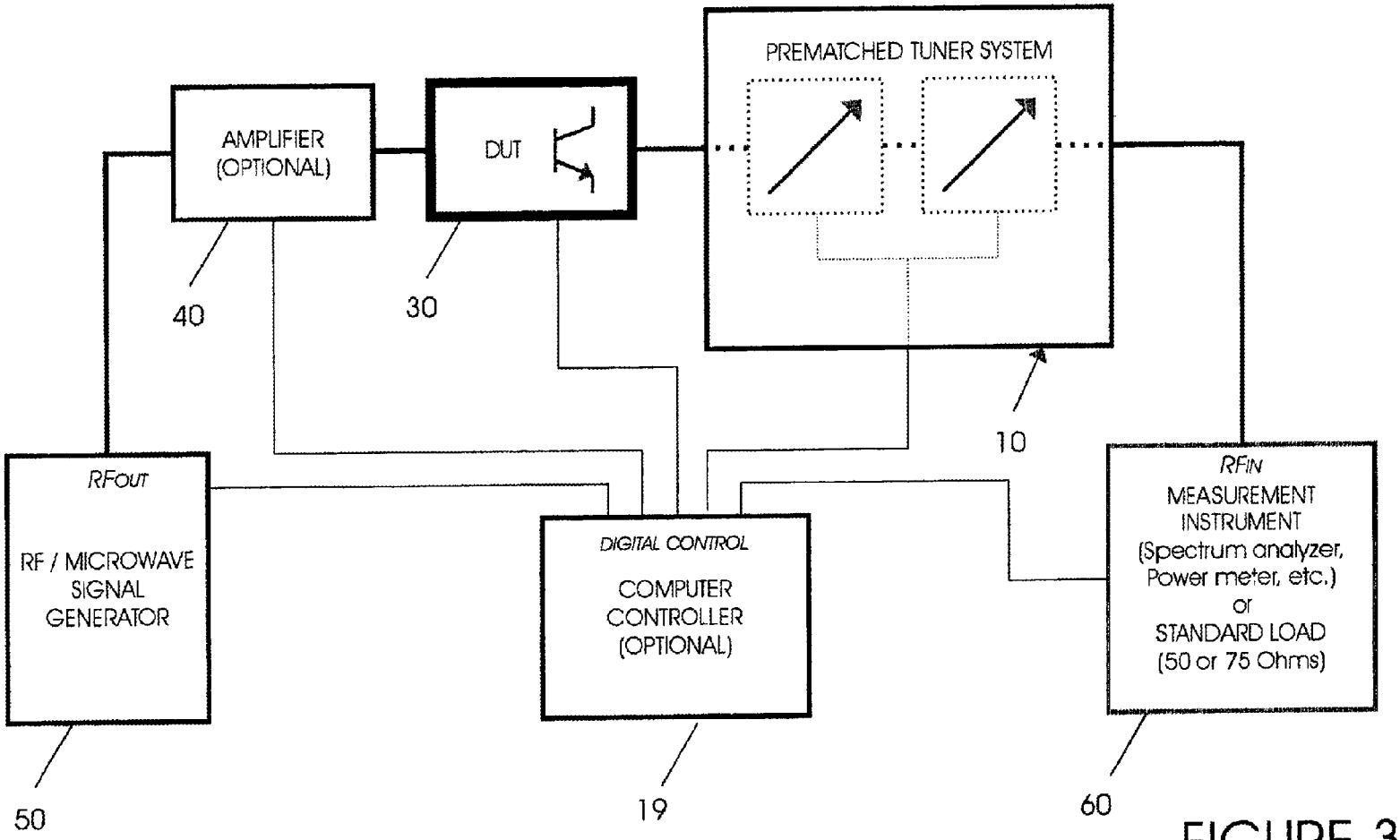
FIG. 3 is a schematic representation of the pre-matched tuner system set-up for DUT output characterisation according to the preferred embodiment of the invention.

FIG. 3 shows a typical set-up for output characterisation of a device under test (DUT) 30, using the system of the present invention. An RF/microwave signal generator 50 is connected to an optional amplifier 40, which is in turn connected to the input of the DUT 30. The output of the DUT 30 is connected to the tuners 10, and the output of the tuners 10 is connected to a measurement instrument 60, such as a spectrum analyser, power meter or standard load. The controller 19 controls the set-up as described.

Figure 5:
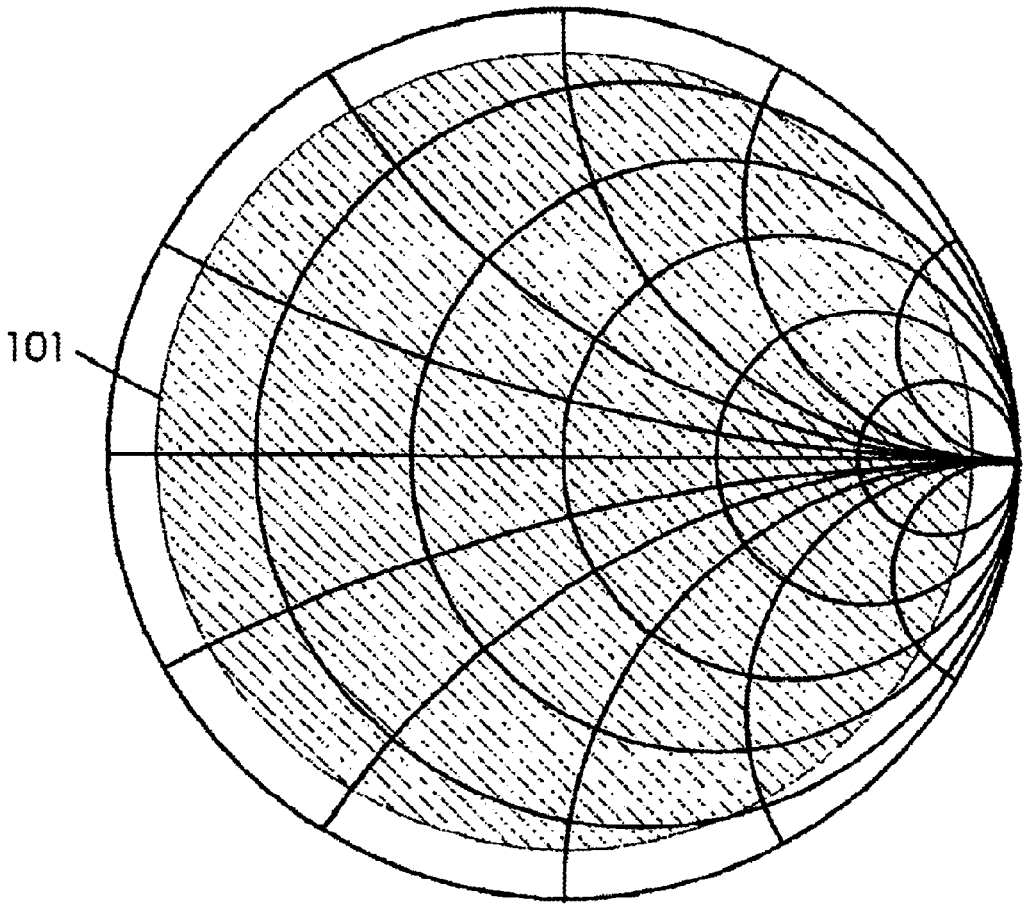
FIG. 5 is a representation of the area on a Smith chart covered by a single tuner.
Figure 6:
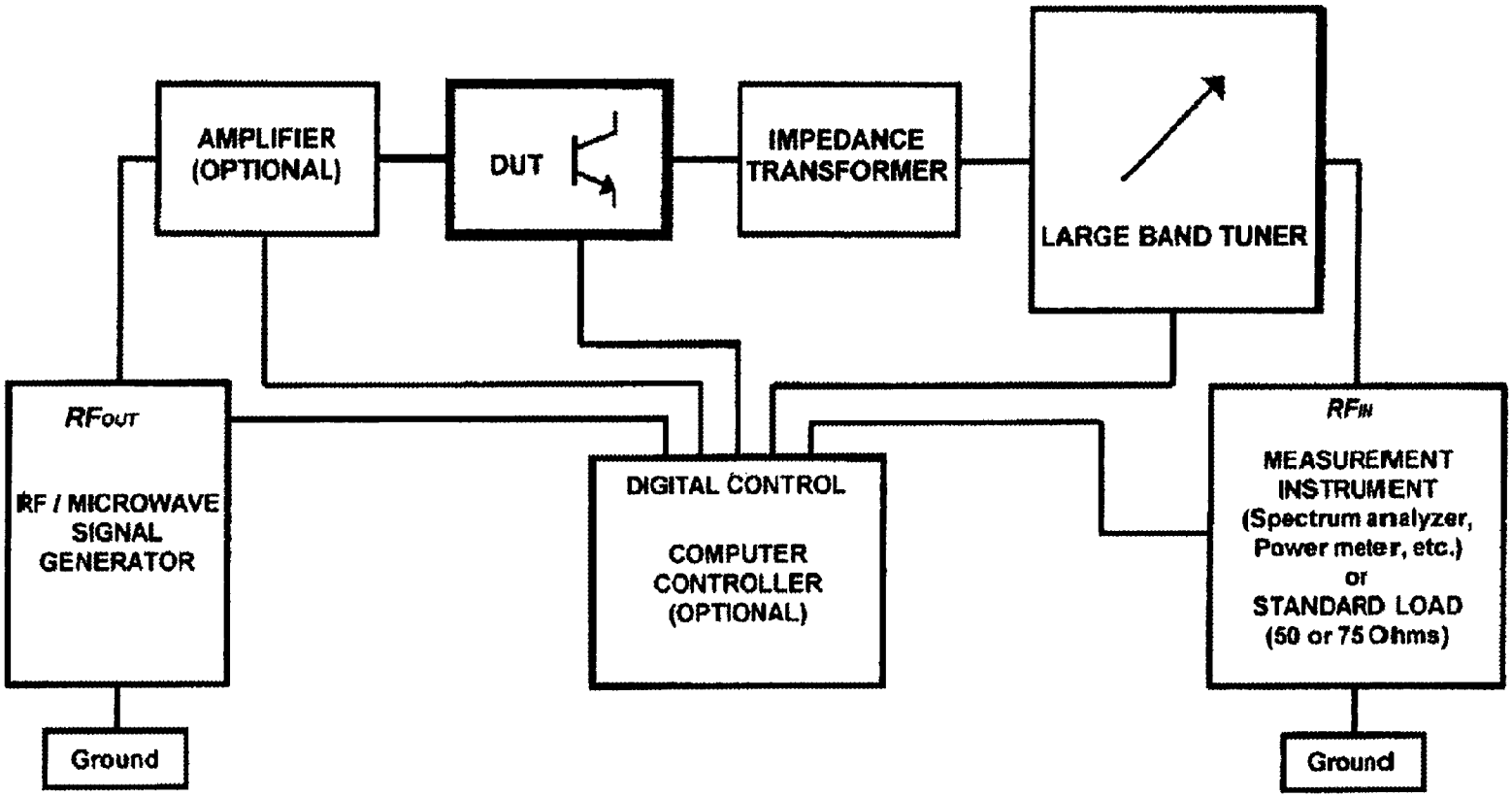
FIG. 6 (Prior Art) is a schematic representation of a load pull set-up with impedance transformer according to the prior art.
Figure 7:
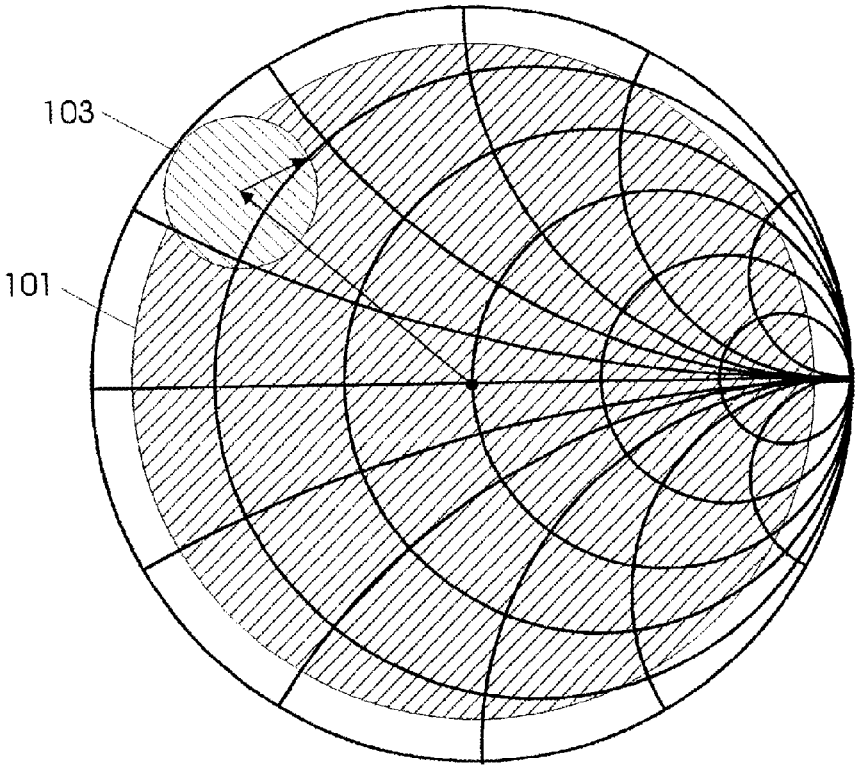
FIG. 7 is a representation of the additional coverage on a Smith chart achieved with the present invention.

Essentially, the present invention permits characterisation of DUTs 30 in regions which are traditionally not covered in typical set-ups, either due to the magnitude of the reflection factors, or due to the magnitude of the power. FIG. 5 shows the area on a Smith chart that can be adequately covered by a single tuner (identified by the region within circle 101). However, in some cases, it is required to characterise the device in the area of the Smith chart that is outside of this circle 101. This area can now be covered efficiently with the system and method of the present invention. In effect, the purpose of the second large-band tuner is to permit characterisation in circle 103 shown in FIG. 7, which in part overlaps circle 101.

Figure 8A:
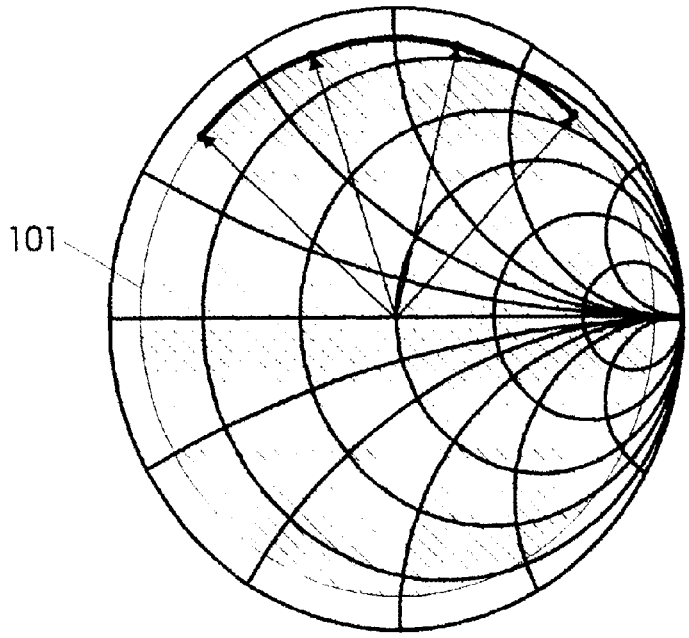
FIG. 8 is a comparison between the results obtained in the search for an optimum at the edge of the Smith chart with a standard tuner set-up and the prematched tuner set-up of the present invention.
Figure 8B:
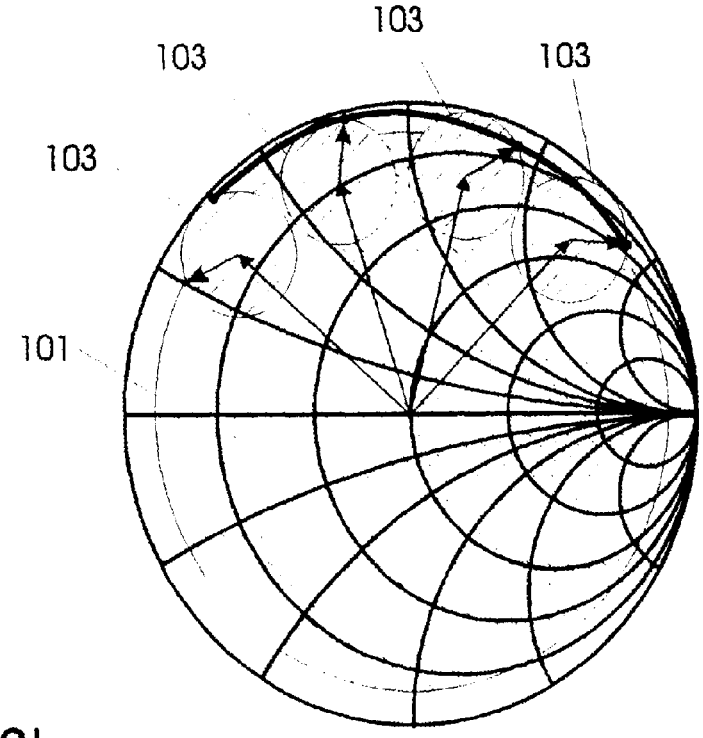

An alternative example of the benefits of the present invention is shown in FIG. 8. A standard tuner will permit characterisation at the edge of the circle, along the thick line of FIG. 8a. However, it is impossible to know if the optimum solution found in FIG. 8a is in fact the best solution, given the physical limitations of a single tuner, as mentioned previously. Consequently, the use of the pre-matched tuner according to the present invention gives the optimum solution illustrated by the thick line in FIG. 8b. As can be seen, there is a difference between the two, and although the two lines follow a same path towards the right-hand side of the Figures, the solutions towards the left-hand side are quite different.

However, in order to reach this area, the tuners must be pre-matched, i.e. properly calibrated.

Figure 9:
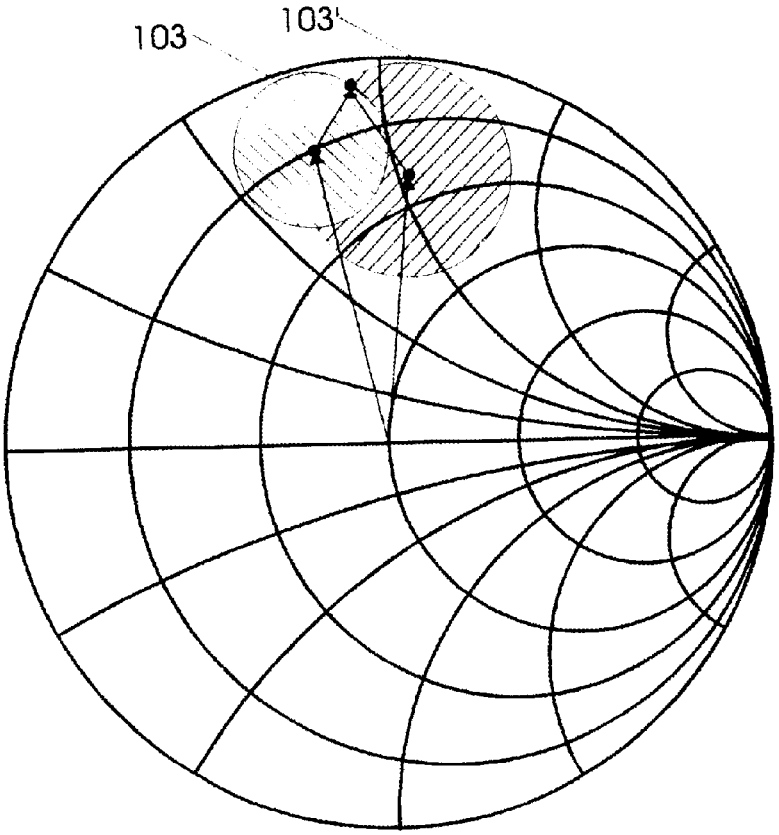
FIG. 9 is a representation of impedance synthesis of multiple solutions a with the system of the present invention.
Figure 11A:
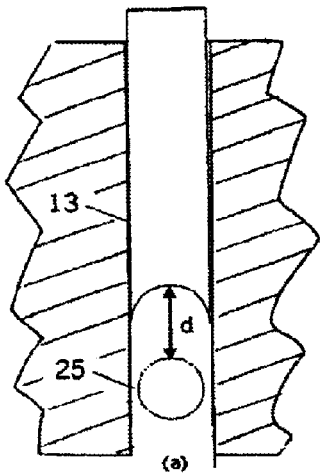
FIGS. 11a, 11b, 11c, and 11d are schematic representations of the distance between the tuning slug and the center conductor (11a, 11b, and 11c) and a graph of the relationship between the distance and the maximum power that can be transmitted (11d).
Figure 11B:
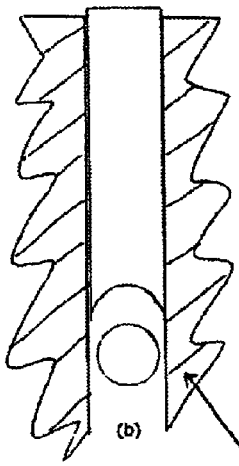
Figure 11C:
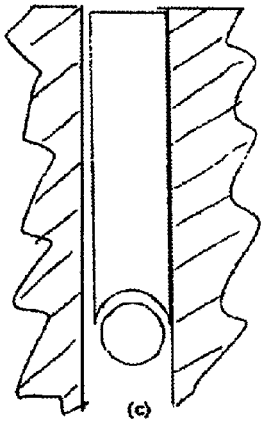
Figure 11D:
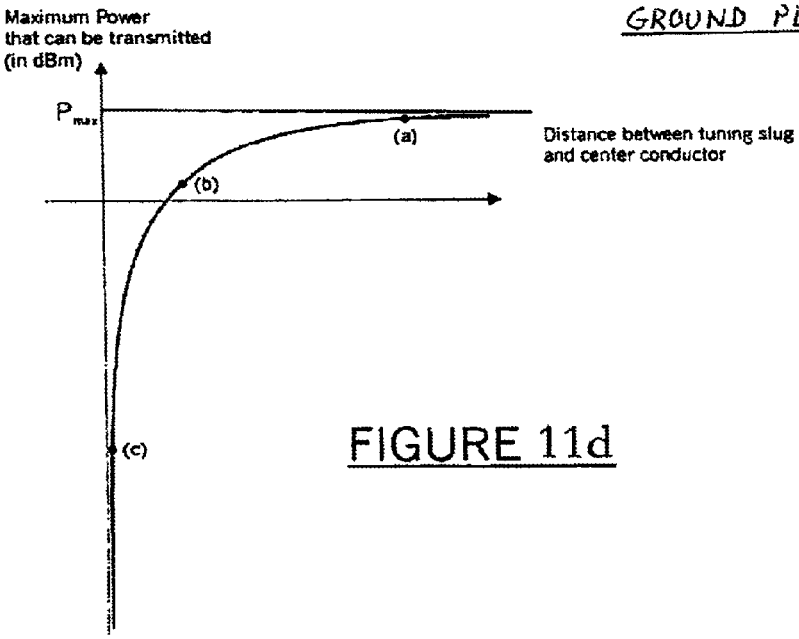

Unlike when one tuner is used, by using two tuners there is an infinite combination of adjustments that would allow the synthesis of a specific impedance (see FIG. 9 which illustrates two solutions to arrive at a given point). Each solution, however, can be characterised by the RF currents that circulate within each tuner, and because of reliability considerations, the best solution can be considered the one that generates the least peak currents. This is better shown in FIG. 11. FIGS. 11a, 11b, and 11c show various distances between the tuning slug 13 and the center conductor 25 of the tuner. FIG. 11d shows the relationship between the distance between the tuning slug 13 and the center conductor 25 and the maximum power that can be transmitted. As shown, the greater the distance, the more power can be transmitted, and conversely, the smaller the distance, the less power can be transmitted mainly because of corona discharges. The system and method of the present invention permits the synthesis of very low impedances while keeping the distances between the tuning slugs 13 and the central conductor 25 as large as possible, thus achieving maximum transmissible powers of one order of magnitude or more compared to a traditional single tuner. Stated simply, with the pre-matched tuning system and method of the present invention, it is possible to keep both slugs 13 around the position shown in FIG. 11b, while for the same impedance, a single tuner would require its slug at the position shown in FIG. 11c.

Furthermore, when optimums in DUT output power, noise, or any other performance characteristic need to be found, the method according to the present invention permits, always using calibration information, to select the best possible path. For instance, if noise is the parameter that requires to be measured, the method of the present invention will look for minima, instead of maxima.

There are a number of solutions that can be implemented for calibrating the set-up of the present invention.

Figure 10:
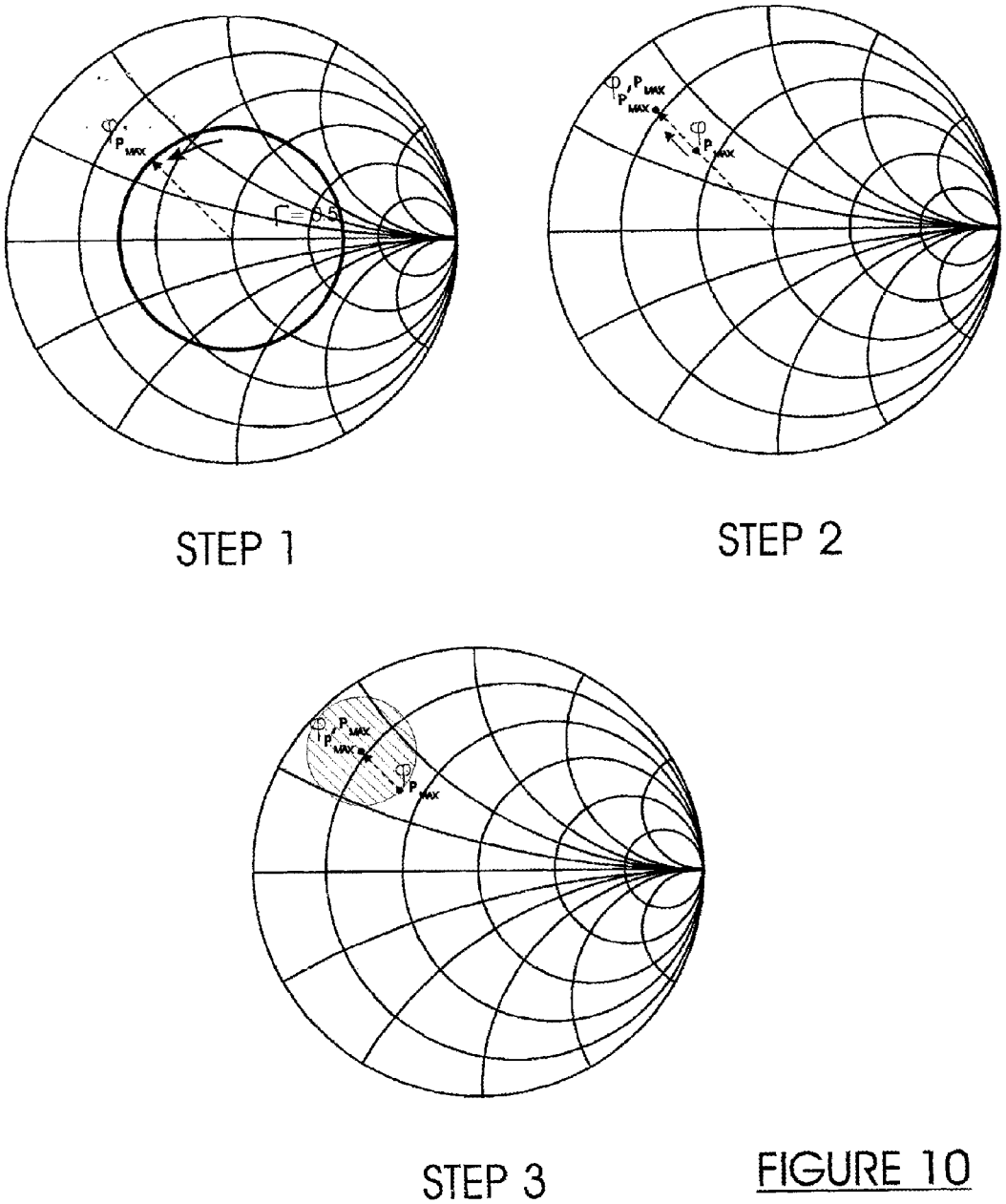
FIG. 10 is a schematic representation of the search for a maximum of a minimum over the Smith chart with the algorithm of the present invention.

Referring now to FIG. 10, assuming that a low impedance device has to be characterized, the simplest approach consists in performing the calibration on the first tuner only and then searching, along the $\Gamma=0.5$ circle, the maximum (or the minimum) of the specified parameter with the first tuner only (Step 1). At the maximum or the minimum, $\Gamma$ is progressively increased along the line which passes through the center of the Smith Chart and the maximum (or minimum) found on the $\Gamma\approx0.5$ circle (Step 2). If a maximum (or minimum) is found before reaching the limits of the first tuner ($\Gamma\sim0.8$–$0.85$) a calibration of the second tuner is performed around that point and the exact position of the maximum (or minimum) is found using the second tuner. If the limits of the first tuner are reached, the same procedure applies, the point around which the second tuner will be calibrated being the furthest on the line that can be covered with the first tuner (Step 3).

However, although straightforward, this technique does have potential disadvantages. In reality, since the system according to the present invention includes two independent tuners, the combined calibration time may be too long for practical considerations. For instance, if each tuner is calibrated at 400 impedance positions per frequency, as a minimum requirement for subsequent tuning flexibility around the Smith Chart (and as presently done for a single tuner), then the combination should be calibrated at $400\times400=160\,000$ points per frequency. At a realistic average of 10 minutes per set of 400 points per tuner per frequency, this would mean nearly three days of continuous measurement sessions per frequency in order to calibrate the tuner system according to the present invention, which is unacceptable.

Consequently, the present invention also provides for alternative methods for calibrating the setup of the present invention, which considerably cut down on the calibration time. They are based on approximations, but have been found to provide very adequate results.

Figure 4:
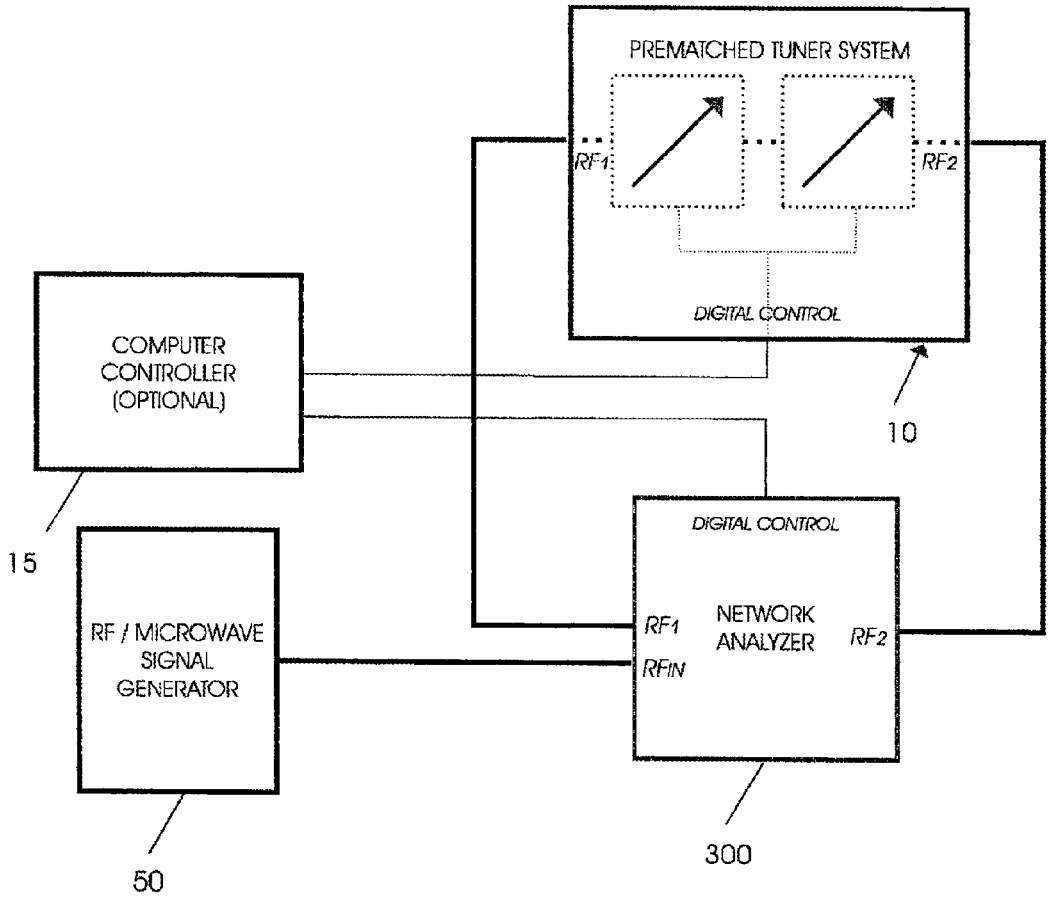
FIG. 4 is a schematic representation of the calibration set-up for the pre-matched tuner system of the present invention.

Preferably, the setup shown in FIG. 4 is used to perform calibration of the pre-matched tuner of the present invention, and consists of an RF/microwave signal generator, the controller 19, the pre-matched tuner 10 and a network analyser 300, connected in the usual manner.

The first calibration method consists of calibrating each tuner independently of the other. The non-calibrating tuner is set to zero (probes retracted) and only the other tuner is calibrated. The residual two-port parameter matrix of the non-calibrating tuner is extracted from the total result by S-parameter matrix de-embedding. This means that a separate S-parameter calibration matrix will be generated for each tuner, and the product of the two matrices is performed by software. Of course, this method permits the interpolation between calibration points, which drives the impedance characterisation capability of the combined tuners into the hundreds of millions of points. Furthermore, since the two tuners work together, finding the points where the tuning probes are the furthest away from the line in order to increase power handling is relatively easy.

The second calibration method consists of two steps. One tuner section (designated the "prematching" section) is experimentally positioned in order to obtain a close to maximum performance of the DUT. This section's position is not modified any more. In step 2, the remaining tuner section (designated the "tuning" section) is calibrated as a normal tuner by positioning the tuner motors at preselected positions and measuring its S-parameters on a calibrated vector network analyzer. This calibration method allows a better tuning resolution and accuracy around the expected DUT optimum reflection factor, but does not allow for subsequent re-adjusting of the prematching section without re-calibrating the whole tuner.

Either calibration algorithm will provide for very high SWR not obtainable by non-prematching tuners as well as higher tuning accuracy and power handling capability. The first method will, in addition, provide for the flexibility of being able to change the focusing area of the final tuning without having to re-calibrate the tuner.

Consequently, the present invention has the following advantages, among others:

1) the architecture permits the synthesis of an impedance within the Smith Chart presenting a reflection factor up to 0.995 in a precise and consistent fashion;
2) the control and peak-search algorithms at the basis of the software routine to control the measurement system give to the measurement system the capability of:
   finding patterns over the Smith Chart in which a specific characteristic is constant;
   finding the optimum adjustment for both tuners so as to minimize currents and optimize accuracy for each measured impedance; and
   finding the optimum (maximum or minimum) over the Smith Chart of a device characteristic (power, noise, etc.) automatically; and
3) two tuner calibration algorithms, which allow the user of the tuner device to be able to optimize the performance of the DUT in a systematic fashion.

The invention thus resides in a novel arrangement for the realisation of a pre-matching tuner, as described herein. The invention also entails a measurement architecture permitting the synthesis of an impedance within the Smith chart presenting a reflection factor less than, or equal to, 0.995 in a precise and consistent fashion. Additionally, this architecture can also focus on high power capability (greater than for a single tuner), or higher characterisation accuracy than for a single tuner.

The first method of calibrating the pre-matched tuner according to the present invention consists of a two step calibration in which the parameters of the pre-matching section are de-embedded from the tuning section.

The second method for calibrating the pre-matched tuner according to the present invention uses as a first step a control and peak-search algorithm at the basis of the software routine to control the pre-matching section and as a second step the actual calibration of the tuning section.

It should be apparent that the controller 19 referred to in the present invention can be embodied as software adapted to run on a typical personal computer.

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. An electro-mechanical microwave tuner comprising a slotted transmission airline, in which two, similar or equal in size, metallic microwave probes are moved in, out and along the slotted airline by means of electrical remote control, in which the microwave probes can be inserted individually into the slot of the airline in such a way as for the physical vertical distance between each probe and the center conductor of the airline to be remotely adjustable from a maximum of at least two times the diameter of the center conductor of the airline to a minimum of zero, said minimum distance corresponding to [physical contact between the probe and the center conductor] *maximum electric field before Corona discharge* and in which the physical horizontal position of each microwave probe is adjustable independently, from a minimum of zero to a maximum of one half of a wavelength at the lowest frequency of operation.

2. An electromechanical microwave tuner as in claim 1, where the said electrical remote control comprises at least four electrical motors, two for each probe, one for the perpendicular and one for the parallel movement to the axis of the airline.

3. An electromechanical microwave tuner as in claim 1, which allows adjustment of the relative phase between the individual microwave reflection vectors, created by the microwave probes, in order to maximize the total reflection of the tuner beyond values of 0.85, whereas the individual reflection vectors can be made to add in amplitude when the phases coincide.

4. An electromechanical microwave tuner as in claim 1, in which the tuning [section] *probe* closest to the device under test is used as the pre-matching [section] *probe* and the [section] *probe* further away of the device under test is used as the tuning [section] *probe*.

5. A calibration method for electromechanical microwave tuners as in claim 1, consisting of measuring its microwave scattering parameters (S-parameters) on a previously independently calibrated microwave vector network analyzer and saving them in a calibration file in a sequence of the following steps:

a) withdrawing vertically the metallic microwave probes [of the prematching and the tuning sections] out of the slabline (initializing);

b) measuring and saving *in memory* the S-parameters of the initialized tuner;

c) measuring the S-parameters of the tuner at a number of horizontal and vertical positions of the *tuning* microwave probe [of the tuning section] and de-embedding the S-parameter matrix of the initialized tuner;

d) saving the resulting S-parameters of the tuning [section] *probe* in a calibration data file;

e) withdrawing the *tuning* microwave probe [of the tuning section] from the slabline;

f) measuring the S-parameters of the tuner at a number of horizontal and vertical positions of the *prematching* microwave probe [of the prematching section];

g) saving the S-parameters of the pre-matching [section] *probe* in another calibration data file;

h) retrieving the S-parameters from the said individual calibration files and cascading them, [in order to generate] *whereby generating* the calibration data for the overall pre-matched tuner for any combination of horizontal and vertical positions of either microwave probe.

6. A calibration method for electro[-]mechanical microwave tuners as in claim 1, consisting of measuring and saving its microwave scattering parameters (S-parameters) on a previously independently calibrated microwave vector network analyzer in a sequence of the following steps:

a) inserting the said tuner in a load pull measurement setup either as input tuner or as output tuner;

b) withdrawing vertically both metallic microwave probes from the slabline of the said tuner;

c) using [manual] remote control to position the *pre-match* metallic microwave probe [of the pre-matching section] of the said tuner in order to optimize the matching conditions for maximum output power or gain or other parameter of a device under test, measured in the said load pull setup;

d) removing the said tuner from the load pull setup and connecting it to the test ports of a vector network analyzer, without changing the position of the pre-matching probe, as determined in the procedure of claim 6c;

e) measuring the S-parameters of the said tuner at a number of horizontal and vertical positions of the microwave *tuning* probe [of the tuning section];

f) saving the measured S-parameter matrix in a calibration data file.

* * * * *